(12) United States Patent
Tachibana et al.

(10) Patent No.: US 6,867,723 B1
(45) Date of Patent: Mar. 15, 2005

(54) AD CONVERTER WITH REDUCED CURRENT CONSUMPTION

(75) Inventors: Suguru Tachibana, Kawasaki (JP); Tatsuo Kato, Kawasaki (JP); Hideo Nunokawa, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 10/774,525

(22) Filed: Feb. 10, 2004

(30) Foreign Application Priority Data

Sep. 9, 2003 (JP) ........................................ 2003-317299

(51) Int. Cl.⁷ ............................................ H03M 1/12
(52) U.S. Cl. ................................ 341/155; 341/161
(58) Field of Search ................................ 341/155, 161, 341/150, 118, 120, 144, 172, 122, 153

(56) References Cited

U.S. PATENT DOCUMENTS

| | | | |
|---|---|---|---|
| 5,894,283 A | * | 4/1999 | Fischer et al. ............... 341/161 |
| 6,252,454 B1 | * | 6/2001 | Thompson et al. ............. 330/9 |
| 6,271,784 B1 | * | 8/2001 | Lynn et al. .................. 341/150 |
| 6,313,779 B1 | * | 11/2001 | Leung et al. ................ 341/155 |
| 2003/0223605 A1 | * | 12/2003 | Blumenau .................... 381/312 |

FOREIGN PATENT DOCUMENTS

| JP | 4-220016 | 8/1992 |
|---|---|---|
| JP | 2000-40964 | 2/2000 |

* cited by examiner

*Primary Examiner*—Peguy Jeanpierre
*Assistant Examiner*—Joseph Lauture
(74) *Attorney, Agent, or Firm*—Arent Fox, PLLC (57) ABSTRACT

An AD converter includes a sample-&-hold circuit which samples and holds an input analog potential in a first period, and generates a signal indicative of a magnitude relation between the held input analog potential and a reference potential in a second period, a plurality of amplifiers connected in series which amplify an output of the sample-&-hold circuit, and a control circuit which controls operating timing of the amplifiers so as to make at least one of the amplifiers start operating in a middle of the first period.

18 Claims, 10 Drawing Sheets

AD CONVERTER WITH REDUCED CURRENT CONSUMPTION

CROSS-REFERENCE TO RELATED APPLICATIONS

The present application is based upon and claims the benefit of priority from the prior Japanese Patent Application No. 2003-317299 filed on Sep. 9, 2003, with the Japanese Patent office, the entire contents of which are incorporated herein by reference.

BACKGROUND OF THE INVENTION

1. Field of the Invention

The present invention generally relates to AD converters for converting analog signals into digital signals, and particularly relates to a successive-approximation-type AD converter which successively compares input potentials with a reference potential.

2. Description of the Related Art

Successive-approximation-type AD converters can be implemented based on relatively simple circuit construction, and are highly suitable for CMOS processes that provide for cost-effective manufacturing. Also, comparatively high-speed conversion can be achieved. Examples of the construction of such successive-approximation-type AD converters are disclosed in Patent Document 1 and Patent Document 2 ([Patent Document 1] Japanese Patent Application Publication No. 2000-40964, and [Patent Document 2] Japanese Patent Application Publication No. 4-220016).

Figure 1:
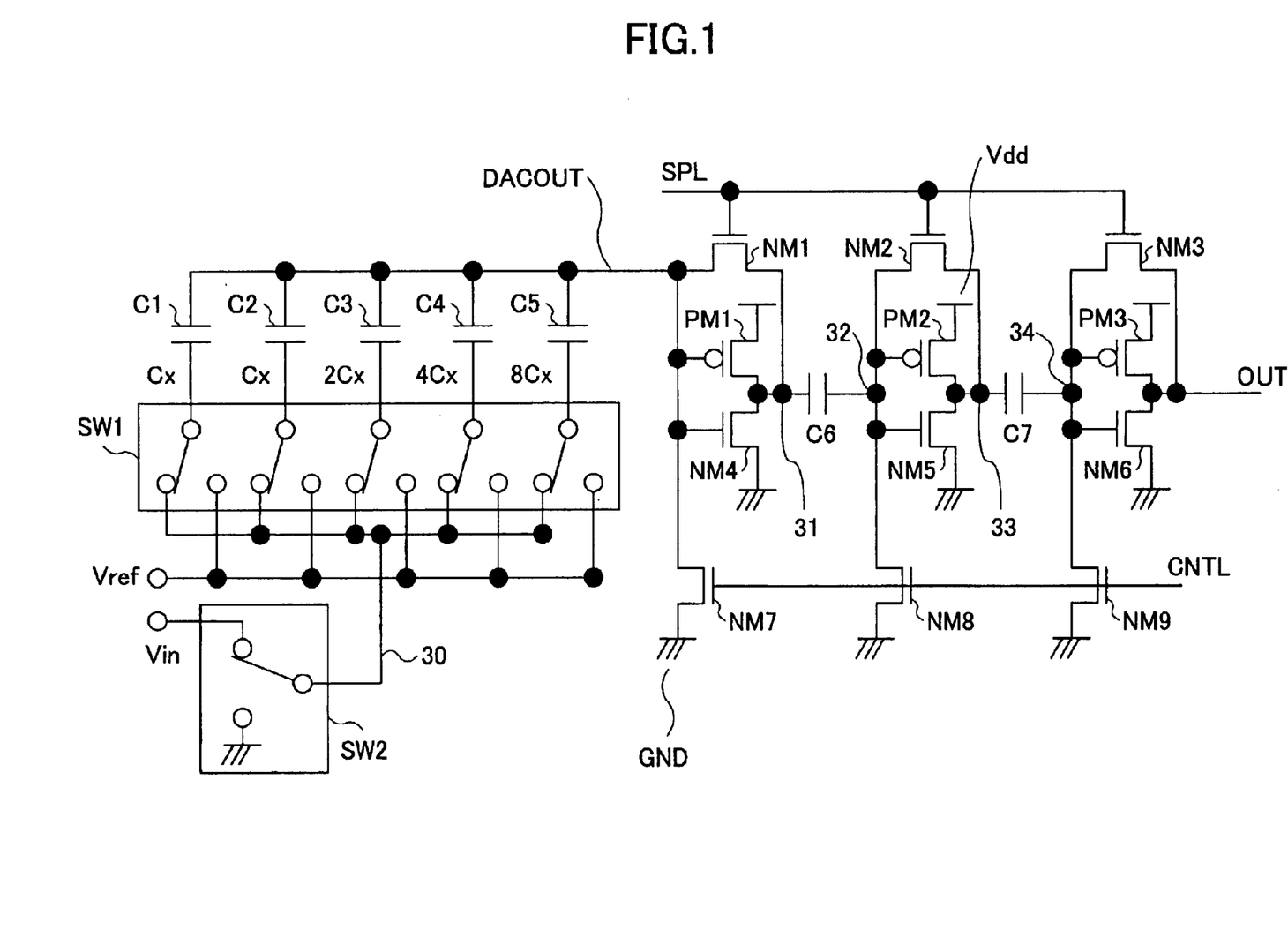
FIG. 1 is a circuit diagram showing the construction of a 4-bit AD converter as an example of a related-art successive-approximation-type AD converter that employs a capacitor DAC.

FIG. 1 is a circuit diagram showing the construction of a 4-bit AD converter as an example of a related-art successive-approximation-type AD converter that employs a capacitor DAC (digital-to-analog converter). The successive-approximation-type AD converter shown in FIG. 1 is shown in Patent Document 2. It should be noted that a successive-approximation-type AD converter typically has 8-bit to 10-bit precision, but a 4-bit AD converter is taken as an example for the sake of simplicity of illustration and explanation.

The successive-approximation-type AD converter of FIG. 1 includes capacitors C1 through C7, switches SW1 and SW2, NMOS transistors NM1 through NM9, and PMOS transistors PM1 through PM3. Vref is a reference potential, and Vin is an input analog potential that is applied to an analog input terminal. SPL is a control signal for controlling sampling operation, and CNTL is a control signal for controlling electric currents. OUT is an output of the successive-approximation-type AD converter. Furthermore, FIG. 1 shows an output node DACOUT of a capacitor DAC, internal nodes 30 through 34 of the successive-approximation-type AD converter, and a ground terminal GND.

Figure 2:
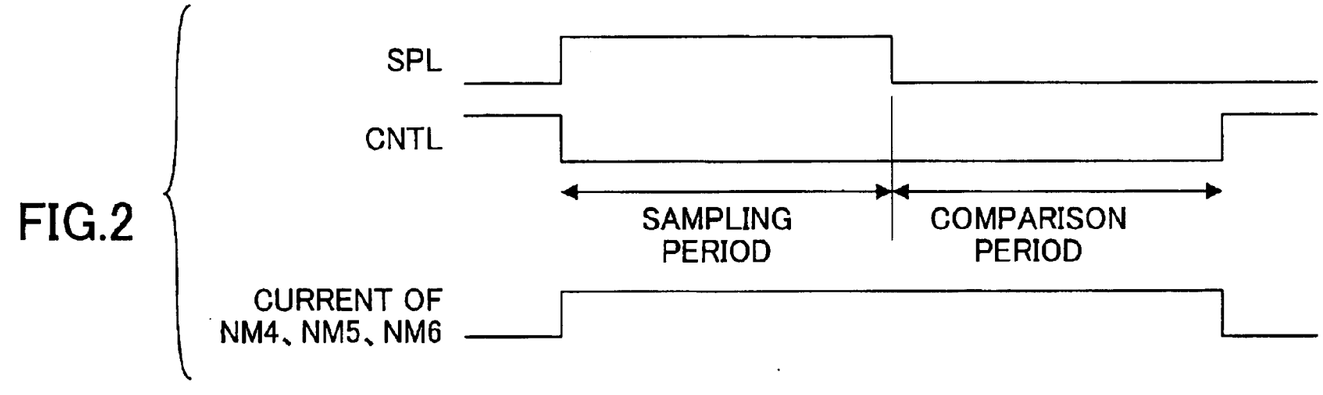
FIG. 2 is a drawing for explaining the operation of the successive-approximation-type AD converter of FIG. 1.

FIG. 2 is a drawing for explaining the operation of the successive-approximation-type AD converter of FIG. 1.

As shown in FIG. 2, prior to the start of AD conversion, the current control signal CNTL is HIGH, and the sampling control signal SPL is LOW. When the current control signal CNTL is HIGH, the NMOS transistors NM7 through NM9 are conductive, so that the output node DACOUT of the capacitor DAC and the internal nodes 32 through 34 are kept at LOW. As a result, the NMOS transistors NM4 through NM6 are in a non-conductive state.

When AD conversion starts, the sampling control signal SPL is changed to HIGH and the current control signal CNTL is turned to LOW in order to sample an analog signal. With the current control signal CNTL being LOW, the NMOS transistors NM7 through NM9 become non-conductive. With the sampling control signal SPL being HIGH, further, the NMOS transistors NM1 through NM3 become conductive.

As NM1 turns on, the potential of the node DACOUT and the potential of the node 31 become equal. The PMOS transistor PM1 and the NMOS transistor NM4 together constitute an inverter at the first stage of the comparator. As an input and an output thereof are short-circuited as described above, the potential of the node DACOUT and the potential of the node 31 are set to a logical threshold (VTL) of the first stage of the comparator.

By the same token, as NM2 turns on, the input-and-output nodes 32 and 33 of the second stage (i.e., the PMOS transistor PM2 and the NMOS transistor NM5) of the comparator are set to a logical threshold VTL. Moreover, as NM3 turns on, the input-and-output nodes 34 and OUT of the third stage (i.e., the PMOS transistor PM3 and the NMOS transistor NM6) of the comparator are set to a logical threshold VTL. At this time, the voltage VTL is applied to the gates of the PMOS transistors PM1 through PM3 and the NMOS transistors NM4 through NM6, so that steady-state currents run through these transistors.

With the potential of the node DACOUT maintained at the logical threshold VTL, the sampling capacitors C1 through C5 are connected to the analog input terminal through the switches SW1 and SW2, and are thus charged with the input potential Vin.

The sampling capacitors C1 through C5 and the switch SW1 constitute a 4-bit DAC. The sampling capacitors C1 and C2 have capacitance Cx. Then, the sampling capacitor C3 is configured to have capacitance 2Cx, the sampling capacitor C4 configured to have capacitance 4Cx, and the sampling capacitor C5 configured to have capacitance 8Cx. In order to maintain relative accuracy, the sampling capacitors C3, C4, and C5 may be constructed by connecting 2, 4, and 8 capacitors in parallel, respectively, where such capacitors have the unit capacitance Cx of the sampling capacitors C1 and C2.

After sampling is finished, comparison is performed so as to determine each bit of digital data successively from the most significant bit. When this is done, both the current control signal CNTL and the sampling control signal SPL are set to LOW.

Specifically, the switches SW1 and SW2 are controlled in such a manner as to couple one of the two end nodes of the sampling capacitors C1 through C5 to either the ground potential or the reference potential Vref. For example, the sampling capacitors C1 through C4 are coupled to the ground potential, and the sampling capacitor C5 is coupled to the reference potential Vref. As a result, the potential of the node DACOUT is set at Vref/2−Vin+VTL. This potential of the node DACOUT is input into the three-stage comparator, thereby determining the magnitude relation of the analog input potential Vin relative to the reference potential Vref. In this manner, the most significant bit is determined.

Similarly, a potential of Vref/4−Vin+VTL or 3Vref/4−Vin+VTL is generated by controlling the switches SW1 and SW2, thereby determining the second bit from the top of the digital data. In a similar manner, each bit is determined successively from higher bits to lower bits. For example, the sampling capacitor C1 and the sampling capacitors C3 through C5 are coupled to the ground potential, and the sampling capacitor C2 is coupled to the reference potential Vref. In this case, the potential of the node DACOUT is set to Vref/16Vin+VTL.

In this manner, coupling is changed in units of capacitance Cx that is equal to one sixteenth of the total capacitance 16Cx (C1 through C5), so that the potential of the node DACOUT is changed in the increments of Vref/16. This makes it possible to determine 4-bit digital data.

SUMMARY OF THE INVENTION

It is a general object of the present invention to provide a successive-approximation-type AD converter that substantially obviates one or more problems caused by the limitations and disadvantages of the related art.

Features and advantages of the present invention will be presented in the description which follows, and in part will become apparent from the description and the accompanying drawings, or may be learned by practice of the invention according to the teachings provided in the description. Objects as well as other features and advantages of the present invention will be realized and attained by a successive-approximation-type AD converter particularly pointed out in the specification in such full, clear, concise, and exact terms as to enable a person having ordinary skill in the art to practice the invention.

To achieve these and other advantages in accordance with the purpose of the invention, the invention provides an AD converter, including a sample-&-hold circuit which samples and holds an input analog potential in a first period, and generates a signal indicative of a magnitude relation between the held input analog potential and a reference potential in a second period, a plurality of amplifiers connected in series which amplify an output of the sample-&-hold circuit, and a control circuit which controls operating timing of the amplifiers so as to make at least one of the amplifiers start operating in a middle of the first period.

In the invention described above, the comparator of the successive-approximation-type AD converter is comprised of the plurality of amplifiers connected in series, and the control circuit is provided for the purpose of controlling the on/of state of an electric current in each of the amplifiers. With this control function of the control circuit, at least one of the amplifiers starts operating in the middle of the first period. For example, a first-stage amplifier that receives the output of the sample-&-hold circuit allows a current to flow therein during the entirety of the sampling period, and amplifiers at the second and following stages allow a current to flow therein only during a latter portion of the sampling period. This makes it possible to reduce an average current consumed by the comparator during the sampling period.

Other objects and further features of the present invention will be apparent from the following detailed description when read in conjunction with the accompanying drawings.

DESCRIPTION OF THE PREFERRED EMBODIMENTS

The successive-approximation-type AD converter as described above achieves high-speed and high-resolution AD conversion by use of comparatively simple circuit construction. As a demand for reduction in electric power with respect to analog circuits such as AD converters is on the increase, reduction in power for the successive-approximation-type AD converters is also strongly desired.

In the successive-approximation-type AD converter as described above, the multi-stage comparator is provided for the purpose of amplifying a small potential appearing at the output node DACOUT of the capacitor DAC to a sufficient signal level. Since through currents constantly flows in the multi-stage comparator even during a sampling period as shown in FIG. 2, there is significant power consumption in the sampling period.

Accordingly, there is a need for a successive-approximation-type AD converter in which power consumption by a comparator during a sampling period is reduced.

In the following, embodiments of the present invention will be described with reference to the accompanying drawings.

In the related-art successive-approximation-type AD converter, a steady-state current runs through each stage of the comparator during a sampling period for the purpose of setting the input and output of the comparator (inverters) to the logical threshold VTL, thereby preparing for subsequent comparison operation. If the potential of the node DACOUT is not maintained at a fixed potential, it is not possible to store a correct potential in the sampling capacitors during the sampling period. Because of this, it is necessary to keep the potential of the node DACOUT at VTL over the entirety of the sampling period. In actual circuit operation, however, the potential of the node DACOUT does not become completely equal to the logical threshold VTL, and it suffices to provide a potential that is substantially close to VTL from a practical viewpoint.

In FIG. 1 showing the related-art successive-approximation-type AD converter, when a potential at the node 32 changes while a current is running through the NMOS transistor NM4, a resulting effect appears at the node DACOUT through the capacitor C6. By the same token, if the potential at the node 34 is changed, its effect appears at the node DACOUT through the capacitors C7 and C6. However, a total capacitance of the sampling capacitors C1 through C5 may be 10 pF for example, and, then, the capacitor C6 is typically as small as about 0.1 pF, so that the effect on DACOUT of a potential change of the node 32 is small.

In this manner, even if the potential of the node 32 changes in the middle of sampling, the operation of the AD converter will be satisfactory as long as a potential shift at the node DACOUT relative to the ideal potential VTL is so minute as not to cause a problem from a practical viewpoint.

In the present invention, the comparator of a successive-approximation-type AD converter is constructed from a plurality of stages of amplification circuits, and control circuitry is provided to control an ON/OFF state of each current running through a corresponding amplification circuit. In the amplification circuit of the first stage that receives an output of the capacitor DAC, a current is allowed to run over the whole sampling period. In the amplification circuits of the second and following stages, a current is allowed to run only during a predetermined later portion of the sampling period. This makes it possible to reduce an average current that is consumed in the comparator during the sampling period.

Figure 3:
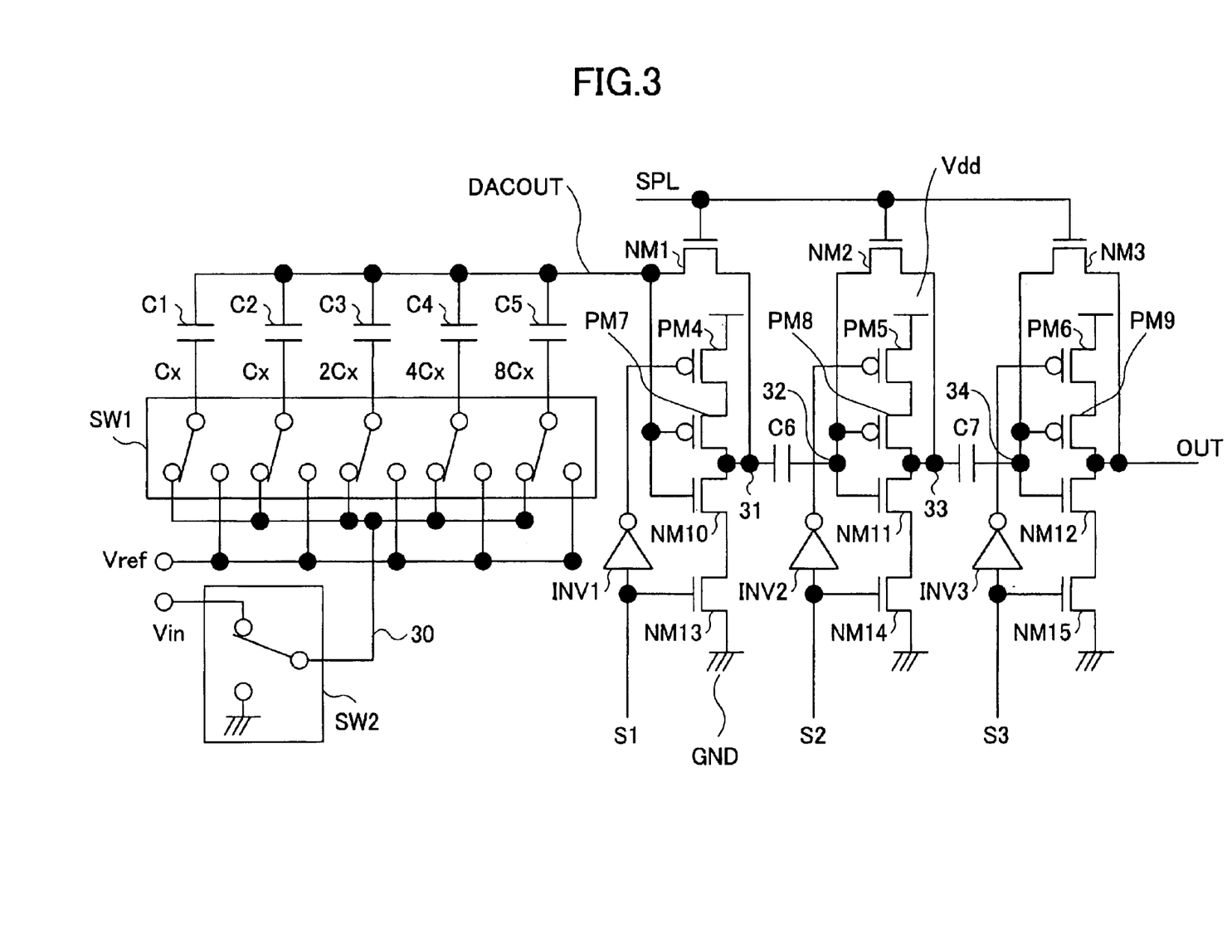
FIG. 3 is a circuit diagram showing the construction of a first embodiment of a successive-approximation-type AD converter according to the invention.

FIG. 3 is a circuit diagram showing the construction of a first embodiment of a successive-approximation-type AD converter according to the invention.

The successive-approximation-type AD converter of FIG. 3 includes capacitors C1 through C7, switches SW1 and SW2, NMOS transistors NM1 through NM3, NMOS transistors NM10 through NM15, PMOS transistors PM4 through PM9, and inverters INV1 through INV3. Vref is a reference potential, and Vin is an input analog potential applied to an analog input terminal. SPL is a control signal for controlling sampling operation, and S1, S2, and S3 are control signals for controlling electric currents. OUT is an output of the successive-approximation-type AD converter. Furthermore, FIG. 3 shows an output node DACOUT of a capacitor DAC, internal nodes 30 through 34 of the successive-approximation-type AD converter, and a ground terminal GND.

The current control signals S1, S2, and S3 control currents of the first stage, the second stage, and the third stage of the comparator, respectively.

Figure 4:
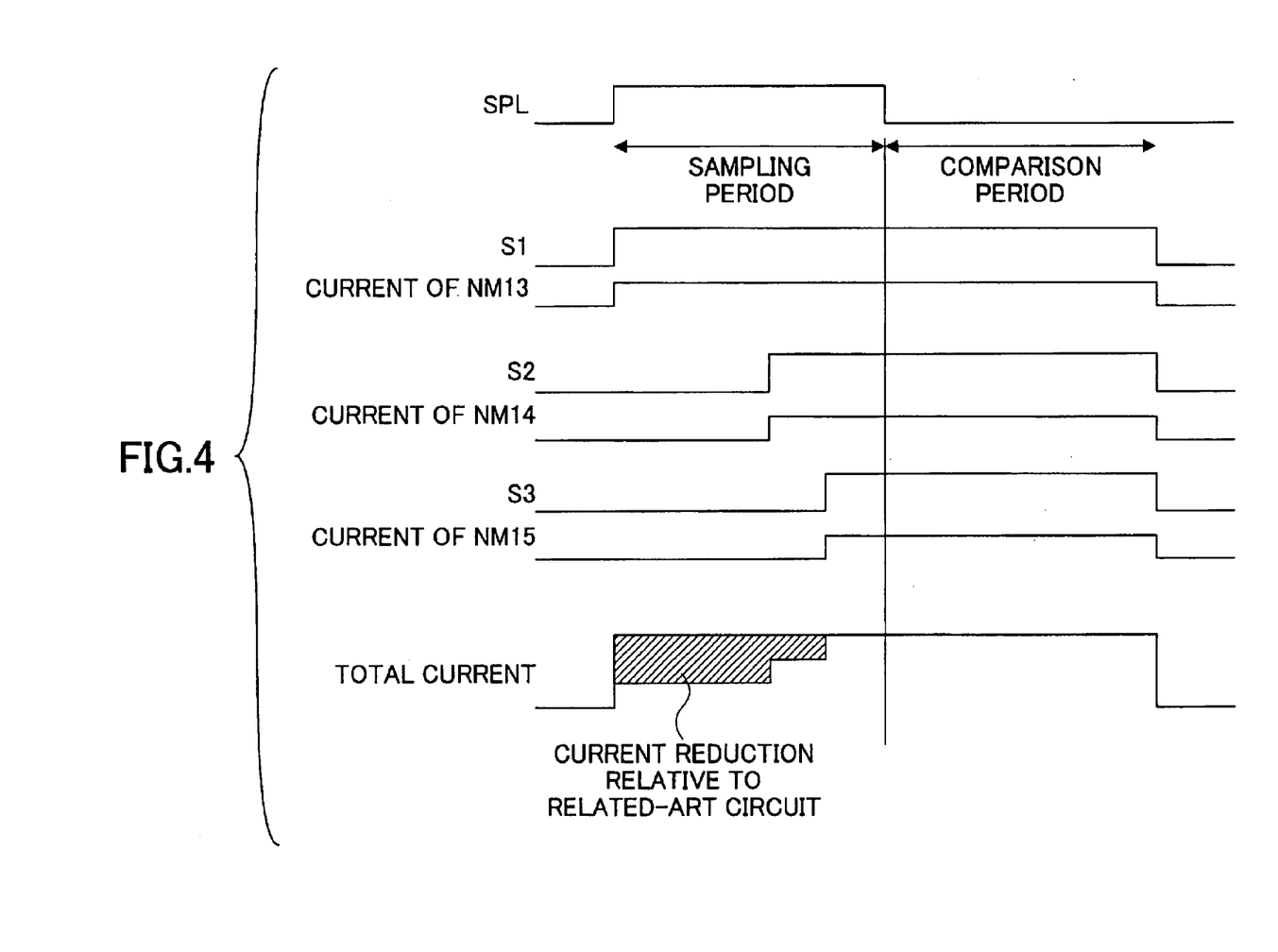
FIG. 4 is a drawing for explaining the operation of the successive-approximation-type AD converter of FIG. 3.

FIG. 4 is a drawing for explaining the operation of the successive-approximation-type AD converter of FIG. 3.

As shown in FIG. 4, prior to the start of AD conversion, the current control signals S1 through S3 are LOW, and the sampling control signal SPL is LOW. With the current control signals S1 through S3 being LOW, the NMOS transistors NM13 through NM15 are non-conductive, so that no current flows in the first stage through the third stage of the comparator.

When AD conversion starts, the sampling control signal SPL is set to HIGH, and the current control signal S1 is set to HIGH in order to sample an analog signal. With the current control signal S1 being HIGH, the NMOS transistor NM13 and the PMOS transistor PM4 become conductive. With the sampling control signal SPL being HIGH, further, the NMOS transistors NM1 through NM3 become conductive.

As NM1 turns on, the potential of the node DACOUT and the potential of the node 31 become equal. The PMOS transistors PM4 and PM7 and the NMOS transistors NM10 and NM13 together constitute the first stage of the comparator. As an input and an output thereof are short-circuited as described above, the potential of the node DACOUT and the potential of the node 31 are set to a logical threshold (VTL) of the first stage of the comparator.

The current control signals S2 and S3 are still at the LOW level at this point of time. As a result, a steady-state current (through current) does not flow in the second stage of the comparator which is comprised of the PMOS transistors PM5 and PM8 and the NMOS transistors NM11 and NM14. Although the input-and-output nodes 32 and 33 of the second stage of the comparator are short-circuited to become an equal potential by the NMOS transistor NM2 being conductive, there is no guarantee that this potential is the logical threshold VTL. Moreover, no steady-state current (through current) does not flow in the third stage of the comparator which is comprised of the PMOS transistors PM6 and PM9 and the NMOS transistors NM12 and NM15. Although the input-and-output nodes 34 and OUT of the third stage of the comparator are short-circuited to become an equal potential by the NMOS transistor NM3 being conductive, there is no guarantee that this potential is the logical threshold VTL.

In this manner, the current control signals S2 and S3 are maintained at the LOW level at an initial stage of sampling, so that a steady-state current does not run either in the second stage or the third stage of the comparator. This achieves reduced power consumption compared with the related-art construction.

With the potential of the node DACOUT maintained at the logical threshold VTL, the sampling capacitors C1 through C5 are coupled to the analog input terminal through the switches SW1 and SW2, and are thus charged with the input potential Vin.

The sampling capacitors C1 through C5 and the switch SW1 constitute a 4-bit DAC. The sampling capacitors C1 and C2 have capacitance Cx. Then, the sampling capacitor C3 is configured to have capacitance 2Cx, the sampling capacitor C4 configured to have capacitance 4Cx, and the sampling capacitor C5 configured to have capacitance 8Cx. In order to maintain relative accuracy, the sampling capacitors C3, C4, and C5 may be constructed by connecting 2, 4, and 8 capacitors in parallel, respectively, where such capacitors have the unit capacitance Cx of the sampling capacitors C1 and C2.

After the sampling capacitors C1 through C5 are charged for a while, the current control signal S2 for the second stage of the comparator is changed to HIGH. In response, the NMOS transistor NM14 and the PMOS transistor PM5 are turned on, so that a steady-state current begins to flow in the second stage of the comparator. Since the sampling control signal SPL is maintained at HIGH during the sampling period, the NMOS transistor NM2 stays conductive. Accordingly, the potential of the nodes 32 and 33 is set to the logical threshold VTL of the second stage of the comparator.

In the following, a potential change occurring at the node DACOUT when the current control signal S2 is changed from LOW to HIGH will be examined. When the current control signal S2 is LOW, the transistors PM5 and NM14 are OFF, so that the potential of the node 32 is situated at the middle potential such as about Vdd/2. As the current control signal S2 changes to HIGH, the potential of the node 32 is set to the logical threshold VTL. The difference between the above-mentioned middle potential and the logical threshold VTL is small, and is assumed to be 500 mV for the sake of explanation. In response to this potential change, electric charge is supplied to the node DACOUT from the capacitor C6, resulting in a change in the potential of the node DACOUT. If the capacitor C6 is 0.1 pF and a total of the sampling capacitors C1 through C5 is 10 pF, then, a potential change at the node DACOUT in response to a 500-mV change of the potential of the node 32 is roughly calculated as 0.1 pF/10 pF×500 mV=0.5 mV. In this manner, even if the current control signal S2 is changed to HIGH in the middle of the sampling period, a resulting potential change at the node DACOUT is small. If the range of an analog input voltage is 5 V and AD conversion has 10-bit precision, the least significant bit is equivalent to 4.9 mV. The potential change of 0.5 mV as described above is thus sufficiently small.

Here, the timing at which the current control signal S2 is changed to HIGH may be set such that the potential of each of the nodes DACOUT and 31 through 33 falls within a required precision range relative to the target potential VTL by the end of the sampling period.

After setting the current control signal S2 of the second stage of the comparator to HIGH, the current control signal S3 of the third stage of the comparator is changed to HIGH in the same manner. As a result, a steady-state current begins to flow in the third stage of the comparator, and the potential of the input-and-output nodes 34 and OUT is set to the logical threshold VTL of the third stage of the comparator.

A voltage change occurring at the node 34 in response to the change of the current control signal S3 from LOW to HIGH is transferred to the node DACOUT through the two capacitors C7 and C6. Therefore, a potential change occurring at the node DACOUT in this case is smaller than the case where the current control signal S2 is changed from LOW to HIGH. The timing at which the current control signal S3 is changed to HIGH may be set such that the potential of each of the nodes DACOUT, 31 through 34, and OUT falls within a required precision range relative to the target potential VTL by the end of the sampling period.

In the invention as described above, the comparator of a successive-approximation-type AD converter is constructed from a plurality of stages of amplification circuits, and control circuitry is provided to control an ON/OFF state of each current running through a corresponding amplification circuit. In the amplification circuit of the first stage that receives an output of the capacitor DAC, a current is allowed to run over the whole sampling period. In the amplification circuits of the second and following stages, a current is allowed to run only during a predetermined later portion of the sampling period. This makes it possible to reduce an average current that is consumed in the comparator during the sampling period. In FIG. 4, the way the total current of the comparator is reduced compared with the related-art circuit is illustrated.

At the timing when the potential of each of the nodes DACOUT, 31 through 34, and OUT approaches the target potential VTL to come within the required precision range, the sampling operation comes to an end, followed by the start of comparison operation. This comparison operation determines each bit of digital data successively from the most significant bit. When this is done, the current control signals S1 through S3 are HIGH, and the sampling control signal SPL is LOW.

Specifically, the switches SW1 and SW2 are controlled in such a manner as to couple one of the two end nodes of the sampling capacitors C1 through C5 to either the ground potential or the reference potential Vref. For example, the sampling capacitors C1 through C4 are coupled to the ground potential, and the sampling capacitor C5 is coupled to the reference potential Vref. As a result, the potential of the node DACOUT is set at Vref/2−Vin+VTL. This potential of the node DACOUT is input into the three-stage comparator, thereby determining the magnitude relation of the analog input potential Vin relative to the reference potential Vref. In this manner, the most significant bit is determined.

Similarly, a potential of Vref/4−Vin+VTL or 3Vref/4−Vin+VTL is generated by controlling the switches SW1 and SW2, thereby determining the second bit from the top of the digital data. In a similar manner, each bit is determined successively from higher bits to lower bits. For example, the sampling capacitor C1 and the sampling capacitors C3 through C5 are coupled to the ground potential, and the sampling capacitor C2 is coupled to the reference potential Vref. In this case, the potential of the node DACOUT is set to Vref/16−Vin+VTL.

In this manner, coupling is changed in units of capacitance Cx that is equal to one sixteenth of the total capacitance 16Cx (C1 through C5), so that the potential of the node DACOUT is changed in the increments of Vref/16. This makes it possible to determine 4-bit digital data.

Figures 5A, 5B, 5C:
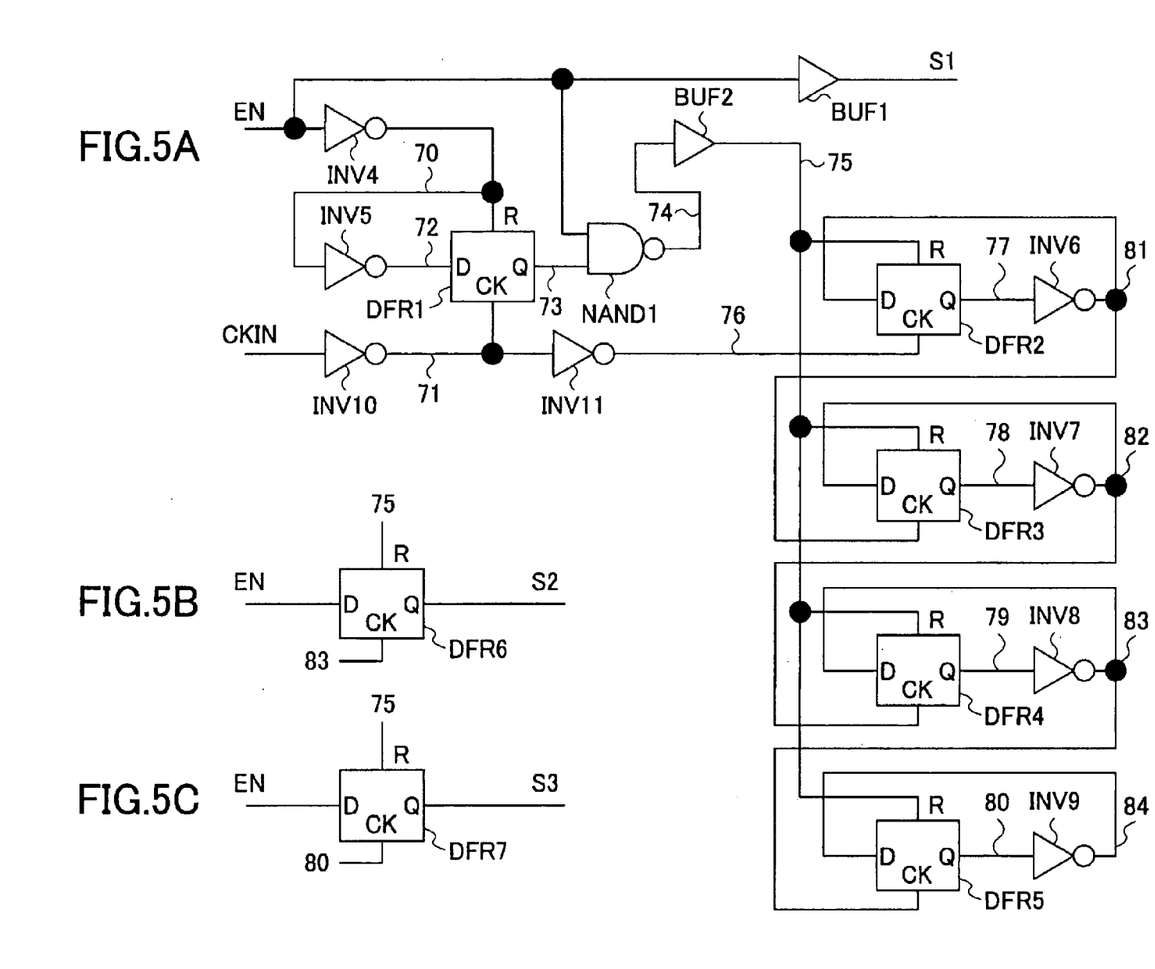
FIGS. 5A through 5C are circuit diagrams showing an example of a current control signal generating circuit which generates current control signals.

FIGS. 5A through 5C are circuit diagrams showing an example of a current control signal generating circuit which generates the current control signals S1 through S3. FIG. 5A illustrates a circuit portion which generates the current control signal S1, FIG. 5B a circuit portion which generates the current control signal S2, and FIG. 5C a circuit portion which generates the current control signal S3.

The current control signal generating circuit of FIGS. 5A through 5C includes D-flip-flops DFR1 through DFR7 with a reset function, inverters INV4 through INV11, a NAND circuit NAND1, and buffers BUF1 and BUF2. In the D-flip-flops DFR1 through DFR7, as the node R is set to HIGH, the output Q changes to LOW out of synchronization. Further, data at the node D is stored in response to a positive transition of the node CK. The current control signal generating circuit of FIGS. 5A through 5C receives a control signal EN and a clock signal CKIN. Moreover, internal nodes 70 through 84 are designated for the sake of explanation.

Figure 6:
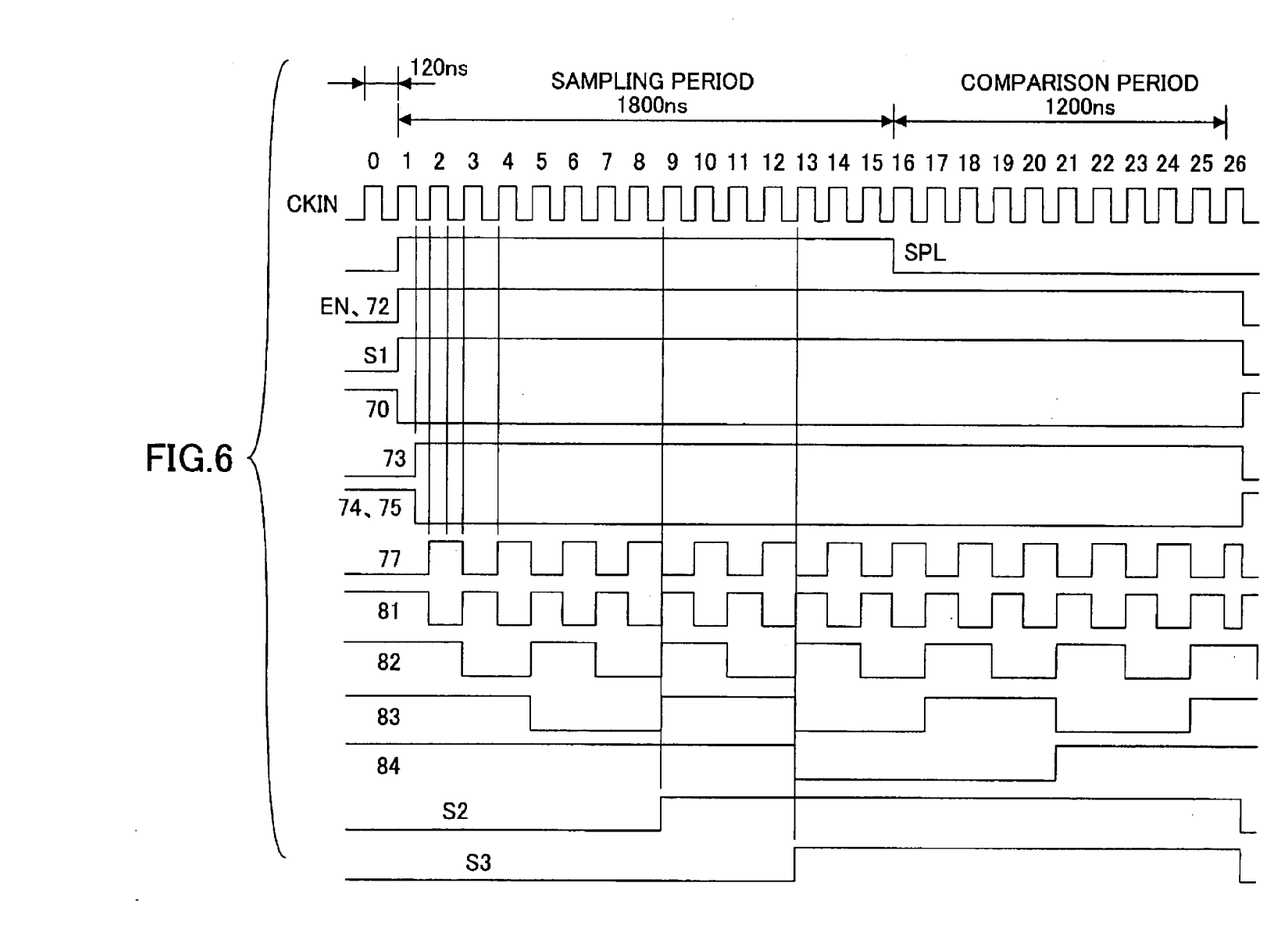
FIG. 6 is a signal timing chart for explaining the operation of the current control signal generating circuit of FIG. 5.

FIG. 6 is a signal timing chart for explaining the operation of the current control signal generating circuit of FIG. 5.

The following description will be given by assuming that the cycle of the clock signal CKIN is 120 ns, the sampling period 1800 ns, and the comparison period 1200 ns. The sampling control signal SPL is generated at timing as shown in FIG. 6. Numbers shown on top of the clock signal CKIN represent sequence numbers of positive transitions of the clock signal. The sampling period of 1800 ns corresponds to 15 cycles of the clock signal CKIN, and the comparison period of 1200 ns is equivalent to 10 cycles of the clock signal CKIN. By counting clock pulses of the clock signal CKIN supplied from an external source, it is possible to set the sampling period and the comparison period to respective desired lengths.

The D-flip-flops DFR2 through DFR5 and the inverters INV6 through INV9 shown in FIG. 5A together make up a frequency divider. The control signal EN is a signal indicative of conversion operation. When this signal is HIGH, A/D conversion is performed. The current control signal S1 stays HIGH over the entire period of the conversion operation as shown in FIG. 4. The control signal EN is thus simply output as the current control signal S1 through the buffer BUF1.

In FIG. 6, the control signal EN changes to HIGH at the positive transition of the first clock pulse of the clock signal CKIN. When EN is LOW prior to this change, the node 70 is HIGH, and the output 73 of the D-flip-flop DFR1 is LOW. It follows that the node 75 is HIGH, so that the outputs 77 through 80, S2, and S3 of the respective D-flip-flops DFR2 through DFR7 are LOW.

When the control signal EN is set to HIGH, the current control signal S1 becomes HIGH, and the node 70 and the node 72 become LOW and HIGH, respectively. After this, the clock signal CKIN shows a negative transition. In response, the node 71 changes to HIGH, and the D-flip-flop DFR1 stores HIGH at the node 72. As a result, the node 73 becomes HIGH, and the node 75 becomes LOW. In response, the D-flip-flops DFR2 through DFR7 disengage from their reset state. At a next positive transition of the clock signal CKIN, HIGH data at the node 81 is stored in DFR2, resulting in the node 77 being HIGH and the node 81 being LOW. The node 81 changes its signal level in synchronization with the positive transition of the clock signal CKIN, serving as a signal whose frequency is a half of the clock signal CKIN.

Similarly, the signal level of the node 82 changes in synchronization with the positive transition of the node 81, serving as a signal having half the frequency of the signal of the node 81. Moreover, the signal level of the node 83 changes in synchronization with the positive transition of the node 82, serving as a signal having half the frequency of the signal of the node 82. Further, the signal level of the node 83 changes in synchronization with the positive transition of the node 82, serving as a signal having half the frequency of the signal of the node 81. Moreover, the signal level of the node 84 changes in synchronization with the positive transition of the node 83, serving as a signal having half the frequency of the signal of the node 83.

In this manner, the clock signal CKIN is frequency-divided to generate count signals at the nodes 81 through 84. Signals having desired timing are then selected from these generated signals, thereby producing the current control signals S2 and S3 having desired timing. In the example of FIGS. 5A through 5C and FIG. 6, the current control signal S2 is changed to HIGH at the positive transition of the ninth clock cycle, and the current control signal. S3 is changed to HIGH at the positive transition of the thirteenth clock cycle.

Figure 7:
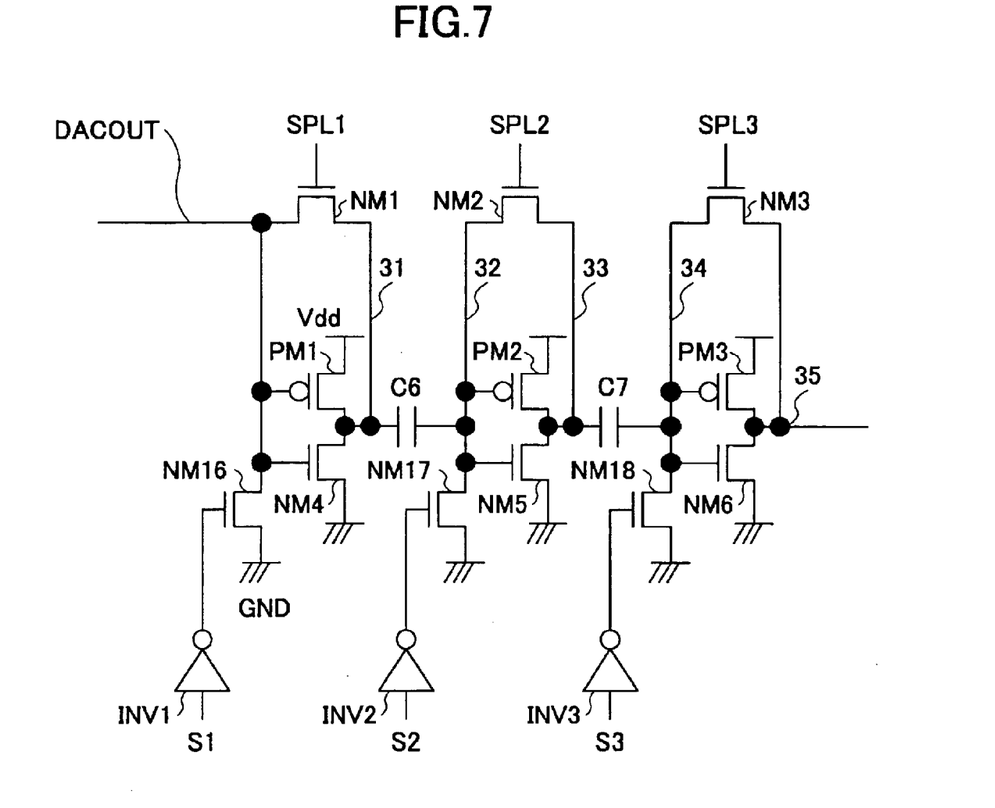
FIG. 7 is a circuit diagram showing the construction of a comparator portion according to a second embodiment of the invention.
Figure 8:
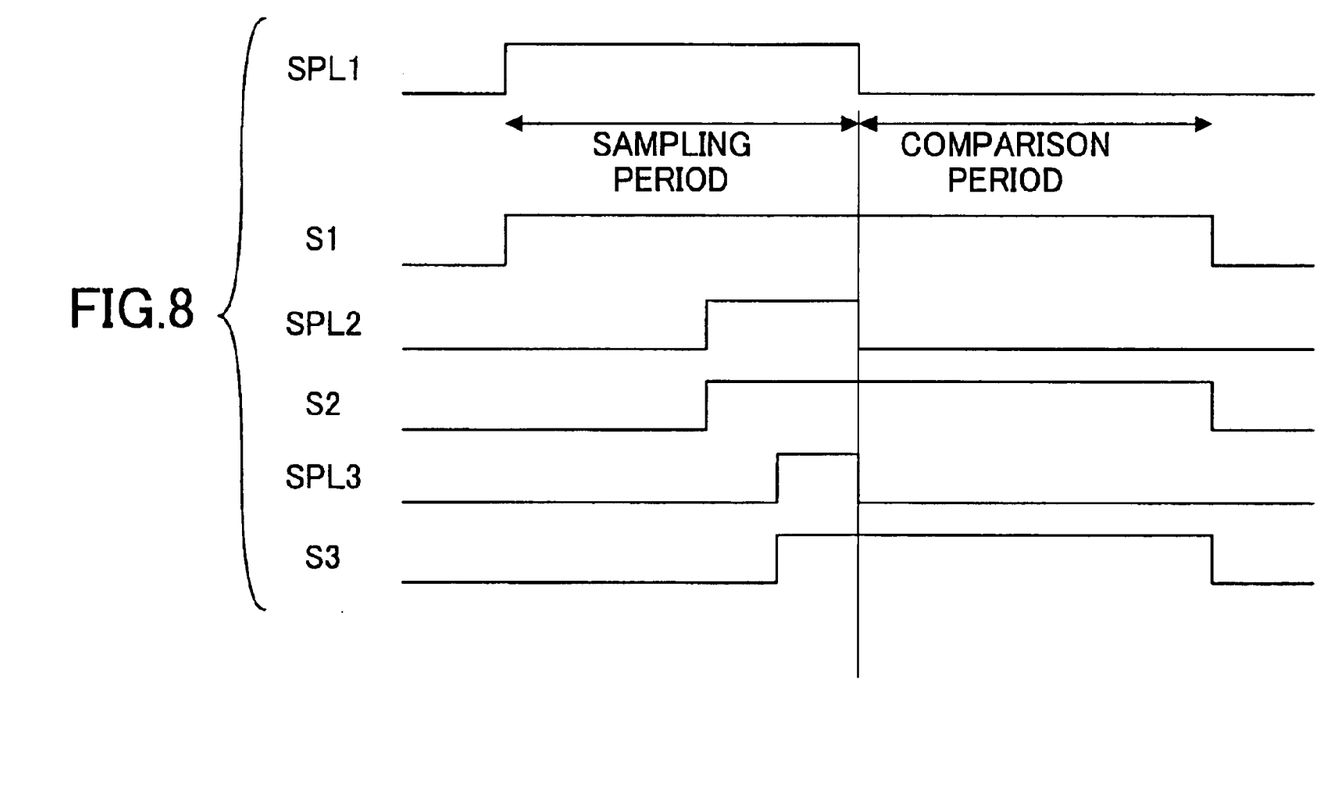
FIG. 8 is a timing chart for explaining the operation of the circuit of FIG. 7.

FIG. 7 is a circuit diagram showing the construction of a comparator portion according to a second embodiment of the invention. FIG. 8 is a timing chart for explaining the operation of the circuit of FIG. 7.

In the construction of the first embodiment shown in FIG. 3, current control is performed by providing a PMOS transistor and an NMOS transistor at the power supply potential side and the ground potential side, respectively, of an amplifier (inverter) of each comparator stage. In the second embodiment shown in FIG. 7, on the other hand, the gate potential of the transistors forming an amplifier (inverter) of each comparator stage is controlled for the purpose of controlling a current running in the amplifier.

In FIG. 7, sampling control signals SPL1, SPL2, and SPL3 are used for the independent control of the NMOS transistors NM1 through NM3, respectively. This makes it possible to independently control the short-circuiting of input-and-output nodes of each comparator stage. Moreover, the current control signals S1 through S3 independently control an ON/OFF state of the NMOS transistors NM16 through NM18 through the inverters INV1 through INV3, respectively. When the current control signals S1 through S3 are LOW, the NMOS transistors NM16 through NM18 are conductive, thereby turning off the NMOS transistors NM4 through NM6, respectively, at the respective comparator stage amplifiers. As a result, no steady-state current flows in the amplifiers.

With the provision of this control function, each stage of the comparator is independently controlled as to the short-circuiting of input-and-output nodes and the ON/OFF state of a steady-state current.

As shown in FIG. 8, at the start of a sampling period, the sampling control signal SPL1 and the current control signal S1 are simultaneously changed to HIGH for the first stage of the comparator. Although the sampling control signal SPL1 changes to LOW at the end of the sampling period, the current control signal S1 stays HIGH until the end of a comparison period. In the middle of the sampling period, the sampling control signal SPL2 and the current control signal S2 are simultaneously set to HIGH for the second stage of the comparator. Although the sampling control signal SPL2 changes to LOW at the end of the sampling period, the current control signal. S2 maintains its HIGH level until the end of the comparison period. After the sampling control signal SPL2 and the current control signal S2 are simultaneously changed to HIGH in the middle of the sampling period, the sampling control signal SPL3 and the current control signal S3 are simultaneously set to HIGH for the third stage of the comparator. Although the sampling control signal SPL3 becomes LOW at the end of the sampling period, the current control signal S3 stays HIGH until the comparison period comes to an end.

In the following, a potential change occurring at the node DACOUT when the current control signal S2 is changed from LOW to HIGH during the sampling period will be examined. When the current control signal S2 is LOW, the NMOS transistor NM17 is ON, so that the potential of the node 32 is LOW. As the current control signal S2 changes to HIGH, the potential of the node 32 is set to the logical threshold VTL, resulting in a potential increase of about 2500 mV. In response to this potential change, electric charge is supplied to the node DACOUT from the capacitor C6, resulting in a change in the potential of the node DACOUT. If the capacitor C6 is 0.1 pF and a total of the sampling capacitors C1 through C5 is 10 pF, then, a potential change at the node DACOUT in response to a 2500-mV change of the potential of the node 32 is roughly calculated as 0.1 pF/10 pF×2500 mV=2.5 mV. In this manner, even if the current control signal S2 is changed to HIGH in the middle of the sampling period, a resulting potential change at the node DACOUT is small. If the range of an analog input voltage is 5 V and AD conversion has 10-bit precision, the least significant bit is equivalent to 4.9 mV. The potential change of 2.5 mV as described above is thus sufficiently small.

In addition, a potential change occurring at the node DACOUT in response to a change of the current control signal S3 from LOW to HIGH during the sampling period is smaller than the potential change caused by the change of the current control signal S2 from LOW to HIGH.

Heretofore, the operation of the successive-approximation-type AD converter according to the invention has been described. It should be noted that the specific circuit construction of the comparator is not limited to the constructions shown in FIG. 3 and FIG. 7, and the invention is similarly applicable to any comparator as long as it is a chopper-type multi-stage comparator.

Figure 9:
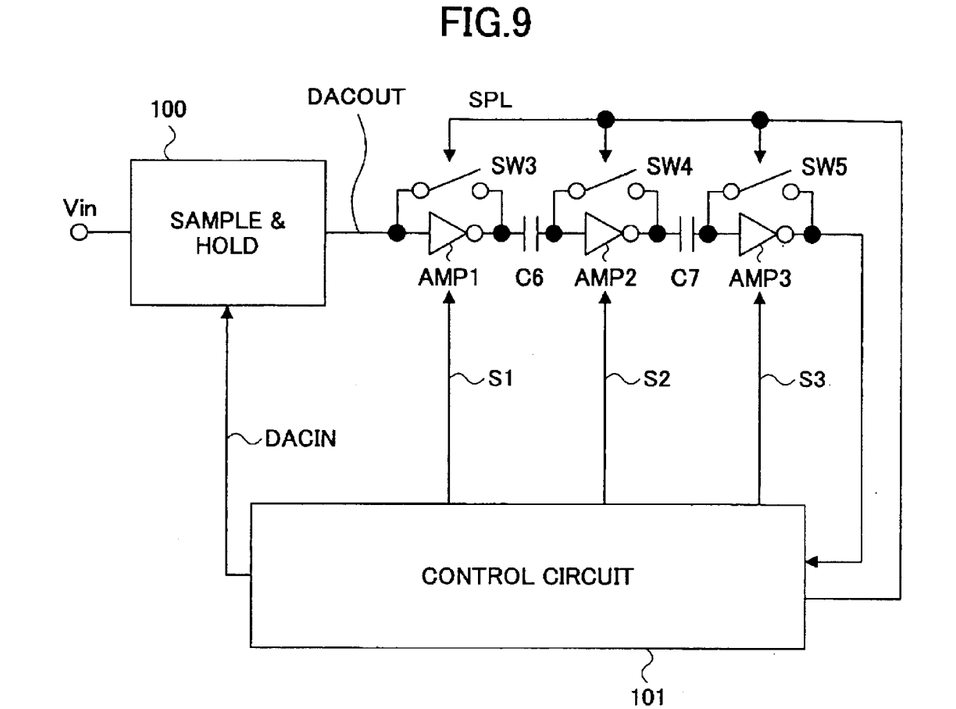
FIG. 9 is a block diagram showing the construction of the successive-approximation-type AD converter according to the principle of the invention.

FIG. 9 is a block diagram showing the construction of the successive-approximation-type AD converter according to the principle of the invention.

The successive-approximation-type AD converter of FIG. 9 includes a sample-&-hold circuit (local DAC circuit) 100, a control circuit 101, amplifiers AMP1 through AMP3, and switches SW3 through SW5. The sample-&-hold circuit 100 operates under the control of the control circuit 101, sampling and holding an input potential Vin in a sampling period, and generating a check potential for comparison of the input potential Vin with a reference potential in a comparison period. The control circuit 101 controls the opening and closing of the switches SW3 through SW5 according to the sampling signal SPL. By closing the switches SW3 through SW5, the input and output nodes of the respective amplifiers AMP1 through AMP3 are short-circuited. Moreover, the control circuit 101 controls an on/off state of the amplifiers AMP1 through AMP3 by use of the current control signals S1 through S3, respectively. When any one of the amplifiers is powered on while its input and output nodes are short-circuited, the potential of the input and output nodes is set to a logical threshold of the amplifier. In this condition, a steady-state current (through current) flows in the amplifier.

In the invention, the control circuit 101 controls the operating period of the amplifier AMP2 of the second stage of the comparator and the amplifier AMP3 of the third stage of the comparator. With this provision, the amplifier AMP2 and the amplifier AMP3 are driven only during a later portion of the sampling period rather than during the whole sampling period, thereby reducing a total of the steady-state currents flowing in the amplifiers.

Figure 10:
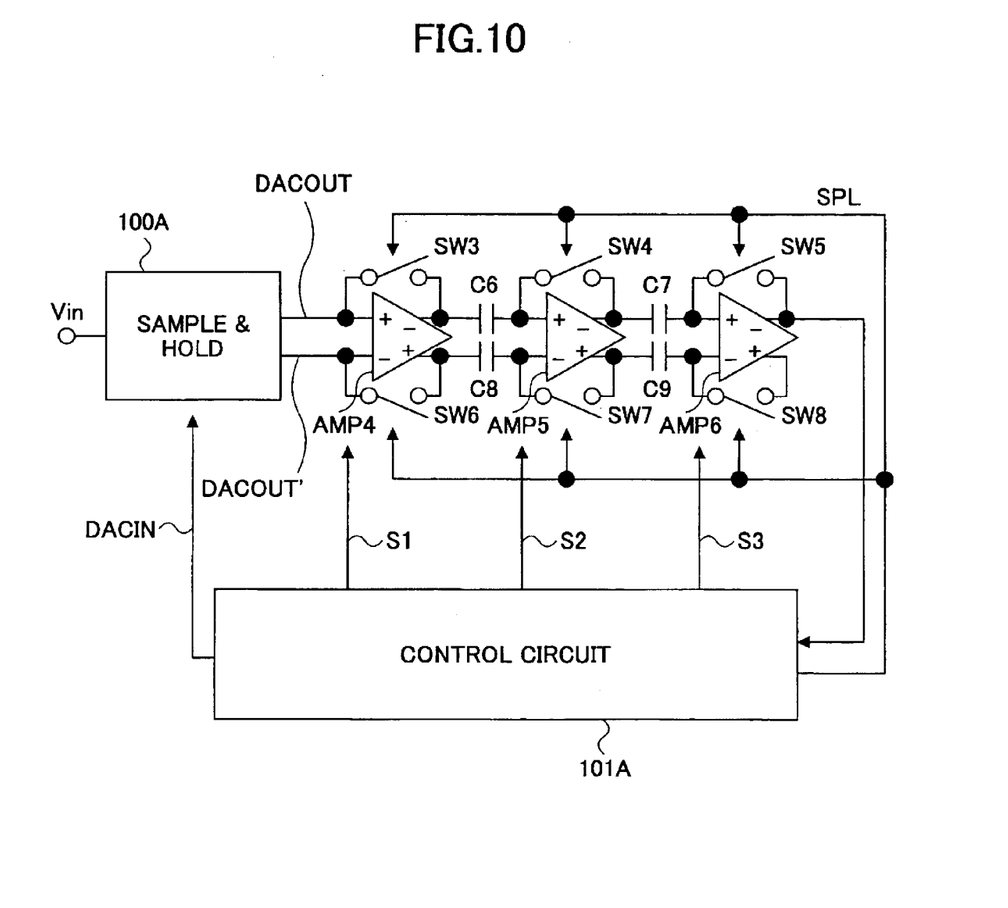
FIG. 10 is a block diagram showing a variation of the successive-approximation-type AD converter of FIG. 9.

FIG. 10 is a block diagram showing a variation of the successive-approximation-type AD converter of FIG. 9.

The successive-approximation-type AD converter of FIG. 10 (includes a sample-&-hold circuit (local DAC circuit) 10A, a control circuit 101A, differential amplifiers AMP4 through AMP6, and switches SW3 through SW8.

In FIG. 9, the comparator is constructed by connecting a plurality of stages of amplifiers that are inverters. In the successive-approximation-type AD converter of FIG. 10, the differential amplifiers AMP4 through AMP6 are connected in series to form a plurality of stages, thereby constructing a comparator. In order to short-circuit two differential inputs and two differential outputs, two switch circuits are provided for each of the differential amplifiers AMP4 through AMP6. The control circuit 101A controls the operating period of the amplifier AMP5 of the second stage of the comparator and the amplifier AMP6 of the third stage of the comparator. With this provision, as in the case of the construction shown in FIG. 9, the amplifier AMP5 and the amplifier AMP6 are driven only during a later portion of the sampling period rather than during the whole sampling period, thereby reducing a total amount of the steady-state currents flowing in the amplifiers.

Further, the present invention is not limited to these embodiments, but various variations and modifications may be made without departing from the scope of the present invention.

What is claimed is:

1. An AD converter, comprising:
   a sample-&-hold circuit which samples and holds an input analog potential in a first period, and generates a signal indicative of a magnitude relation between the held input analog potential and a reference potential in a second period;
   a plurality of amplifiers connected in series which amplify an output of said sample-&-hold circuit; and
   a control circuit which controls operating timing of said amplifiers so as to make at least one of said amplifiers start operating in a middle of the first period.

2. The AD converter as claimed in claim 1, further comprising switch circuits, each of which short-circuits an input and an output of a corresponding one of said amplifiers, wherein said control circuit closes said switch circuits in the first period to short-circuit the input and the output.

3. The AD converter as claimed in claim 2, wherein said control circuit makes a specified amplifier start operating from a start of the first period, said specified amplifier being one of sa id amplifiers that directly receives the output of said sample-&-hold circuit.

4. The AD converter as claimed in claim 2, wherein said control circuit controls operating timing of said amplifiers such that a delay in a start of operation increases toward a tail end of the series of said amplifiers.

5. The AD converter as claimed in claim 1, wherein said sample-&-hold circuit includes a plurality of condensers and a plurality of switches.

6. The AD converter as claimed in claim 1, wherein said control circuit controls said sample-&-hold circuit such that said sample-&-hold circuit successively generates the signal indicative of a magnitude relation while changing the reference potential in the second period.

7. The AD converter as claimed in claim 1, wherein said amplifiers are inverters.

8. The AD converter as claimed in claim 1, wherein said amplifiers are differential amplification circuits.

9. The AD converter as claimed in claim 1, wherein said amplifiers are configured such that a steady-state current flows in any one of said amplifiers when the one of said amplifiers operates in the first period.

10. An AD converter, comprising:
    a sampling circuit which samples an input analog potential in a first period, and generates a signal responsive to the input analog potential in a second period;
    a plurality of amplifiers connected in series which amplify an output of said sampling circuit; and
    a control circuit which makes a current flow in at least one of said amplifiers only during a later portion of the first period.

11. The AD converter as claimed in claim 10, further comprising switch circuits, each of which short-circuits an input and an output of a corresponding one of said amplifiers, wherein said control circuit closes said switch circuits in the first period to short-circuit the input and the output.

12. The AD converter as claimed in claim 11, wherein said control circuit makes a specified amplifier start operating from a start of the first period, said specified amplifier being one of said amplifiers that directly receives the output of said sampling circuit.

13. The AD converter as claimed in claim 11, wherein said control circuit controls operating timing of said amplifiers such that a delay in a start of operation increases toward a tail end of the series of said amplifiers.

14. The AD converter as claimed in claim 10, wherein said sampling circuit includes a plurality of condensers and a plurality of switches.

15. The AD converter as claimed in claim 10, wherein said control circuit controls said sampling circuit such that said sampling circuit successively generates the signal responsive to the input analog potential.

16. The AD converter as claimed in claim 10, wherein said amplifiers are inverters.

17. The AD converter as claimed in claim 10, wherein said amplifiers are differential amplification circuits.

18. The AD converter as claimed in claim 10, wherein said amplifiers are configured such that a steady-state current flows in any one of said amplifiers when the one of said amplifiers operates in the first period.

* * * * *